United States Patent [19]
Manohar et al.

[11] Patent Number: 5,963,053
[45] Date of Patent: Oct. 5, 1999

[54] SELF-BIASING CMOS PECL RECEIVER WITH WIDE COMMON-MODE RANGE AND MULTI-LEVEL-TRANSMIT TO BINARY DECODER

[75] Inventors: Amar S. Manohar; Bor Lee, both of San Jose, Calif.

[73] Assignee: Pericom Semiconductor Corp., San Jose, Calif.

[21] Appl. No.: 08/947,430

[22] Filed: Oct. 9, 1997

[51] Int. Cl.[6] .................................... H03K 19/0175
[52] U.S. Cl. .................... 326/60; 326/37; 326/82; 326/86
[58] Field of Search ................ 326/82–83, 86, 326/59–60, 37, 49–50, 31, 34

[56] References Cited

U.S. PATENT DOCUMENTS

| | | | |
|---|---|---|---|
| 4,631,428 | 12/1986 | Grimes | 326/59 |
| 4,958,133 | 9/1990 | Bazes | 330/253 |
| 5,255,287 | 10/1993 | Davies et al. | 326/60 |
| 5,332,935 | 7/1994 | Shyu . | |
| 5,355,391 | 10/1994 | Horowitz et al. | 375/36 |
| 5,361,040 | 11/1994 | Barrett, Jr. | 330/253 |
| 5,412,336 | 5/1995 | Barrett, Jr. et al. | 327/560 |
| 5,448,183 | 9/1995 | Koreeda | 325/33 |
| 5,453,704 | 9/1995 | Kawashima | 326/81 |
| 5,455,524 | 10/1995 | Ikeya et al. | 326/73 |
| 5,467,369 | 11/1995 | Vijeh et al. | 375/224 |
| 5,479,115 | 12/1995 | Ueda et al. | 326/63 |
| 5,491,443 | 2/1996 | Zarabadi | 327/391 |
| 5,519,728 | 5/1996 | Kuo | 375/257 |
| 5,528,636 | 6/1996 | Sevenhans et al. | 375/371 |
| 5,570,042 | 10/1996 | Ma | 326/63 |
| 5,585,743 | 12/1996 | Kenji et al. | 326/73 |
| 5,604,450 | 2/1997 | Borkar et al. | 326/60 |

OTHER PUBLICATIONS

Chappell et al, "Fast CMOS ECL Receivers With 100–mV Worst–Case Sensitivity", IEEE JSSC, vol. 23, No. 1, Feb. 1998 pp. 59–67.

*Primary Examiner*—Jon Santamauro
*Attorney, Agent, or Firm*—Stuart T. Auvinen

[57] ABSTRACT

A pseudo-emitter-coupled-logic (PECL) receiver has a wide common-mode range. Two current-mirror CMOS differential amplifiers are used. One amplifier has n-channel differential transistors and a p-channel current mirror, while the second amplifier has p-channel differential transistors and an n-channel current mirror. When the input voltages approach power or ground, one type of differential transistor continues to operate even when the other type shuts off. The outputs of the two amplifiers are connected together and each amplifier receives the same differential input signals. The tail-current transistor is self-biased using the current-mirror's gate-bias. This self biasing of each amplifier eliminates the need for an additional voltage reference and allows each amplifier to adjust its biasing over a wide input-voltage range. Thus the common-mode input range is extended using self biasing and complementary amplifiers. The complementary self-biased comparators can be used for receiving binary or multi-level-transition (MLT) inputs by selecting different voltage references for threshold comparison. Using the same reference on both differential inputs eliminates a second reference for multi-level inputs having three levels. Thus binary and MLT inputs can be detected and decoded by the same decoder.

12 Claims, 6 Drawing Sheets

.75 * V(PK-PK)
.25 * V(PK-PK)

SELF-BIASING CMOS PECL RECEIVER WITH WIDE COMMON-MODE RANGE AND MULTI-LEVEL-TRANSMIT TO BINARY DECODER

BACKGROUND OF THE INVENTION

1. Field of the Invention

This invention relates to a CMOS self-biased comparator, and more particularly to a pseudo-ECL receiver and a binary-to-multi-level-transition (MLT-3) decoder each using the CMOS self-biased comparator.

2. Description of the Related Art

High-speed communications networks such as Fast (100 Mbps) Ethernet and asynchronous-transfer-mode (ATM) networks use differential signals for transmitting data. The speed of these differential signals is increased when they transition over a reduced voltage range, since output capacitances are charged and discharged over a smaller voltage range, requiring less current.

Small-signal differential drivers and differential amplifiers are needed for these network applications. In the past, bipolar NPN transistors arranged as emitter-coupled-logic (ECL) gates were used. However, complementary metal-oxide-semiconductor (CMOS) is a less expensive technology than bipolar. Bipolar NPN transistors have been integrated into CMOS processes resulting in a technology known as BiCMOS. Although BiCMOS is fast, it is also more expensive than standard CMOS.

Small-signal techniques have been used for BiCMOS and CMOS using pseudo-ECL voltage levels known as PECL. Various ECL and PECL differential receivers have been designed. See for example U.S. Pat. No. 5,479,115, which uses BiCMOS, and U.S. Pat. No. 5,570,042, using CMOS. An example of a bipolar ECL receiver is found in U.S. Pat. No. 5,448,183.

While such ECL and PECL differential receivers are effective, using a standard CMOS process is highly desirable, as circuits become more integrated as pricing pressures intensify. Another desirable feature is a wide common-mode input range so that the input voltage does not have to fall in a strict narrow voltage range. Common-mode variations affect both of the differential signals by the same amount so that data is not lost. Termination, power-supply variations, and voltage drops across transmission lines can alter common-mode input voltages. Using differential input signals cancels out these variations since both inputs are altered by the same amount. However, as the change in input voltages increases, some receivers are less responsive and may even fail. Thus, receivers often have a limited common-mode range. See U.S. Pat. No. 4,958,133 for a receiver with a wide common-mode range. Unfortunately, that receiver uses a bi-stable amplifier, which can be temperamental.

Self-Biased CMOS Differential Receiver

Another CMOS differential receiver is disclosed by Chappell et al. in "Fast CMOS ECL Receivers With 100-mV Worst-Case Sensitivity", IEEE JSSCC, vol. 23, no. 1, pp. 59–67 (February 1988). The standard CMOS current-mirrored differential amplifier is compared to several variations, including a self-biased receiver. FIG. 1 is a diagram of a prior-art self-biased CMOS differential receiver. P-channel transistors 22, 24 have their gates connected together and to the drain of p-channel transistor 22 so that they have the same gate-to-source voltage and thus the same approximate current drive. This is known as a current mirror. N-channel transistors 26, 28 are a differential pair receiving an input voltage Vin and a reference voltage Vref on their gates. As Vin rises above Vref, n-channel transistor 26 has a higher current drive than n-channel transistor 28, causing the drain of n-channel transistor 26 to fall in voltage while the drain of n-channel transistor 28 rises in voltage. The change in voltage is amplified further by inverter 21 and output.

Tail n-channel transistor 29 has its gate controlled by a reference voltage in standard CMOS sense amplifiers. For self-biasing, the gate of tail n-channel transistor 29 is instead connected to node 30, which is connected to the gates of the current-mirror p-channel transistors 22, 24. Thus, a separate bias voltage for tail n-channel transistor 29 is not required.

COMMON-MODE RANGE LIMITED BY TURN-OFF OF DIFFERENTIAL TRANSISTORS

Self-biasing of tail n-channel transistor 29 allows for a wide common-mode range, especially compensating for power-supply and P/N device variations. However, the range is still somewhat limited, as eventually differential n-channel transistors 26, 28 turn off as the common-mode input voltage is reduced to around 1 volt above ground. Thus the self-biased CMOS differential receiver of FIG. 1 still has a limited common-mode range because differential n-channel transistors 26, 28 shut off for low input voltages. A self-biased differential CMOS receiver with a still wider common-mode input range is desired.

Multi-Level-Transitions

Another desirable feature is the use of multi-level transitions (MLT). MLT allows more information to be encoded into a signal than for binary transitions. Thus, slower MLT transmission rates can achieve the same data throughput as high-rate binary signals.

FIG. 2 is a waveform diagram of binary and MLT-3 encoding. A non-return-to-zero (NRZ) waveform 10 is encoded to a NRZ-invert-on-ones (NRZI) waveform 12 by causing a transition to occur for each NRZ one, but no transition to occur for each NRZ zero. NRZI waveform 12 is considered a better encoding for data transmission than NRZ waveform 10 because transitions occur with more regularity and at a lower rate due to a minimum run-length of 1 or higher in coding.

NRZI waveform 12 is received as a pair of differential signals RX+, RX– driven by transmitting NRZI as RX+ waveform 14 and transmitting a complement of NRZI as RX– waveform 16. Of course, RX+, RX– waveforms 14, 16 have a small voltage swing of perhaps 0.8 volts, peak-to-peak.

For MLT encoding, each transition of NRZI waveform 12 causes a transition of MLT waveforms 18, 19. Like binary differential signals, MLT differential signals are complements of each other. When RX+ is high, RX– is low, and vice-versa. Both RX+ and RX– can be at the middle voltage level at the same time. A larger peak-to-peak voltage swing of 1.6 volts can be used for MLT signals so that each transition is 0.8 volt.

MLT-to-Binary Decoder Using Two Voltage References

FIG. 3 is a diagram of a MLT input with two reference voltages used for detection. An MLT input can be detected and decoded by comparison to two voltage thresholds. The input waveform FIG. 3 is compared to an upper voltage of 75% of he peak-to-peak voltage, and a high is signaled when the input voltage exceeds 0.75*Vpk–pk. The input waveform is also compared to a lower reference voltage of 25% of the peak-to-peak swing. A low is signaled when the input is below 0.25*Vpk–pk. When neither a low nor a high is signaled, then the voltage is at the mid-level.

FIG. 4 is a diagram of a prior-art MLT-to-binary decoder that compares the input to two voltage references. One of the differential inputs, RX +, is equalized and amplified by amplifier 38 and the amplified voltage connected to the non-inverting input of comparator 32 and the inverting input of comparator 34. Comparator 32 signals when RX+ exceeds the upper reference voltage, 0.75*Vp–pk, while comparator 34 signals when RX+ is below the lower reference voltage, 0.25*Vpk–pk. The outputs of comparators 32, 34 can then be decoded to extract the binary information encoded by the MLT signal. For example, OR gate 36 outputs when the output is either high or low but not at the mid level. Thus OR gate 36 can output an equivalent binary NRZI waveform with binary-signal transitions at each MLT transition.

While such MLT-to-binary decoders are useful, having two voltage references is undesirable. When one voltage reference changes with respect to the other voltage reference, the voltage thresholds also change, possibly resulting in loss of information decoded. Common-mode input changes can adversely affect decoding with two voltage references. Generating multiple voltage references is undesirable, as additional current may be required to generate each voltage reference.

What is desired is a comparator for use in a PECL receiver and in a MLT-to-binary decoder implemented in standard CMOS. A wide common-mode input range is desired. It is desired that the input range extend almost to power and ground for maximum input range. Self-biasing is desirable without using unforgiving bi-stable elements and feedback. Since existing network equipment may use binary or multi-level encoding, a decoder is desired that accepts either binary or MLT input signals. A MLT-to-binary decoder is desired. It is desired to use a single voltage reference for the MLT decoder rather than two voltage references. It is desired to take advantage of the differential signals to eliminate the second voltage reference.

SUMMARY OF THE INVENTION

A differential receiver decodes binary-encoded or multi-level-encoded differential inputs. The differential receiver has a pair of differential inputs including a first differential input and a second differential input. The pair of differential inputs receive an input data stream encoded with binary data or encoded with multi-level-encoded data.

A reference-voltage generator generates a binary reference-voltage and a multi-level reference-voltage. A reference-voltage selector is coupled to the reference-voltage generator. It outputs the binary reference-voltage when the input data stream is encoded with binary data, but it outputs the multi-level reference-voltage when the input data stream contains the multi-level-encoded data. The reference-voltage selector outputs a reference-voltage.

A first differential comparator receives the first differential input the reference voltage from the reference-voltage selector. It compares a first voltage of the first differential input to the reference-voltage and outputs a first detection signal when the first voltage exceeds the reference-voltage. A second differential comparator receives the second differential input the reference voltage from the reference-voltage selector. It compares a second voltage of the second differential input to the reference-voltage and outputs a second detection signal when the second voltage exceeds the reference-voltage.

A decoder receives the first detection signal from the first differential comparator and the second detection signal from the second differential comparator. It outputs a decoded binary data stream. The decoder outputs the first detection signal as the decoded binary data stream when the input data stream is encoded with binary data, but the decoder outputs as the decoded binary stream a logical combination of the first detection signal and the second detection signal when the input data stream contains the multi-level-encoded data. Thus a single reference-voltage is compared to the first differential input and to the second differential input to detect and decode multi-level-encoded data.

In further aspects of the invention the first differential comparator and the second differential comparator each have an n-type amplifier with a pair of differential n-channel transistors that receive one of the first or second differential inputs as a received input the reference-voltage. The n-type amplifier generates an n-amp output responsive to a difference in voltage between the reference-voltage and the received input. A p-type amplifier has a pair of differential p-channel transistors that receive the received input the reference-voltage. The p-type amplifier generates a p-amp output responsive to a difference in voltage between the reference-voltage and the received input.

A connection means connects the n-amp output to the p-amp output as a composite output. A buffer receives the composite output. It buffers the composite output to generate the first or second detection signal. Thus the n-type amplifier and the p-type amplifier both compare the received input to the reference-voltage in parallel.

In further aspects, for low voltages of the received input, the differential p-channel transistors of the p-type amplifier continue to operate and conduct current while the differential n-channel transistors of the n-type amplifier are shut off, not conducting current. For high voltages of the received input, the differential n-channel transistors of the n-type amplifier continue to operate and conduct current while the differential p-channel transistors of the p-type amplifier are shut off, not conducting current. Thus either the n-type amplifier or the p-type amplifier continue to operate at the high or low voltages. A common-mode input-voltage range of the differential comparator is extended.

In still further aspects the n-type amplifier has a current mirror of p-channel transistors that generate a first internal bias voltage to control current supplied by the current mirror to the differential n-channel transistors. The p-type amplifier further has a current mirror of n-channel transistors to generate a second internal bias voltage to control current supplied by the current mirror to the differential p-channel transistors.

In further aspects the n-type amplifier has a tail n-channel transistor coupled to source terminals of the differential n-channel transistors. The tail n-channel transistor controls a tail current in response to a control gate. The control gate is connected to the first internal bias voltage generated by the current mirror of p-channel transistors. The p-type amplifier has a tail p-channel transistor coupled to source terminals of the differential p-channel transistors. The tail p-channel transistor controls a second tail current in response to a second control gate. The second control gate is connected to the second internal bias voltage generated by the current mirror of n-channel transistors. Thus the tail p-channel transistor and the tail n-channel transistor are self-biased by the current mirror.

DETAILED DESCRIPTION

The present invention relates to an improvement in self-biased comparators for use in multi-level-input decoding and for PECL receivers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that the self-biasing current-mirrored CMOS differential amplifier is a simple yet sensitive receiver. Self-biasing extends the common-mode by altering the bias of the tail n-channel transistor as the input common-mode changes, providing more adaptability than separately-biased tail transistors.

The problem with the prior-art self-biased CMOS amplifier is that the differential pair of n-channel transistors shut off when the input voltages drop too low. Very low input voltages result in low gate-to-source voltages. When the gate-to-source voltages drop below the transistor's threshold voltage, the transistor turns off, no longer responding to changes in input voltages. Thus the amplifier stops functioning at low input voltages.

High input voltages do not cause this problem, because the high voltages merely increase the gate-to-source voltages of the differential n-channel transistors. The high input voltages lower the drain voltage and thus increase the gate-to-source voltage of the current mirror p-channel transistors. Thus input voltages are limited only for low voltages, not high voltages.

OPPOSITE-TYPE AMPLIFIER COMPENSATES FOR COMMON-MODE PROBLEM

The inventors have realized that the complementary nature of CMOS can be exploited to solve the common-mode problem. A current-mirror amplifier using differential p-channel transistors does not turn off for low input voltages. The differential p-channel amplifier instead turns off for high input voltages. A second current-mirror amplifier using differential p-channel transistors can be used in parallel with the differential n-channel amplifier. The differential p-channel amplifier operates for extremely low input voltages while the differential n-channel amplifier operates for high input voltages. Both amplifiers operate for mid-range input voltages, increasing performance and sensitivity for these intermediate input voltages.

Figure 1:
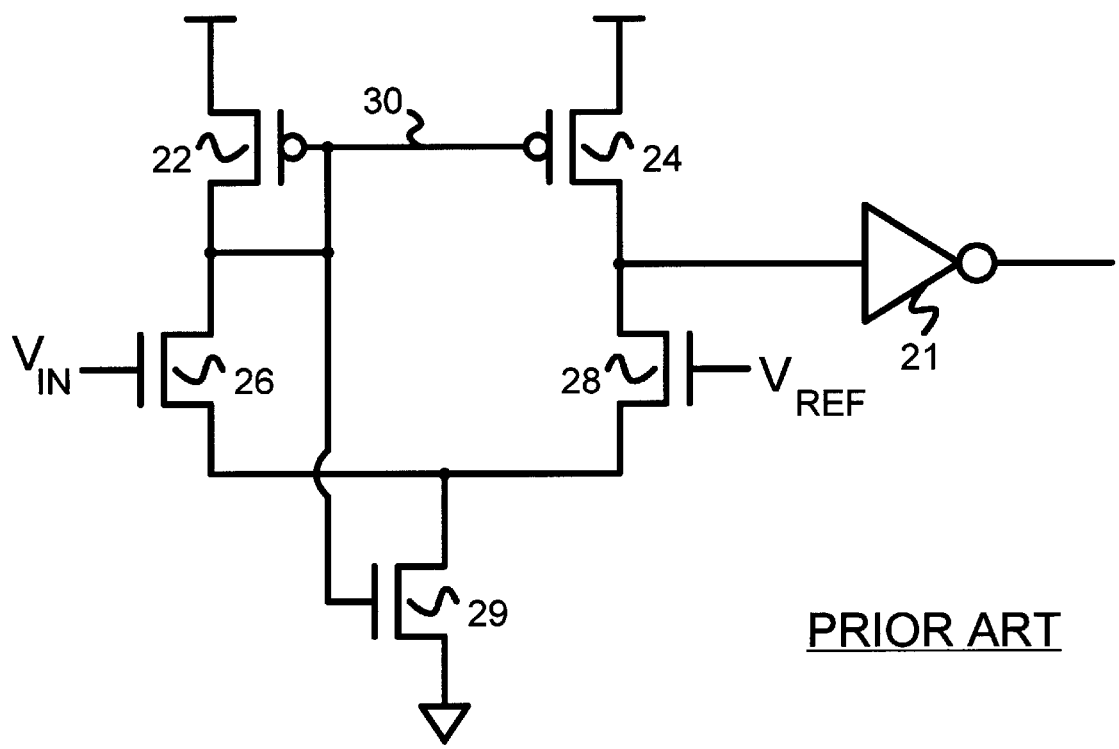
FIG. 1 is a diagram of a prior-art self-biased CMOS differential receiver.
Figure 2:
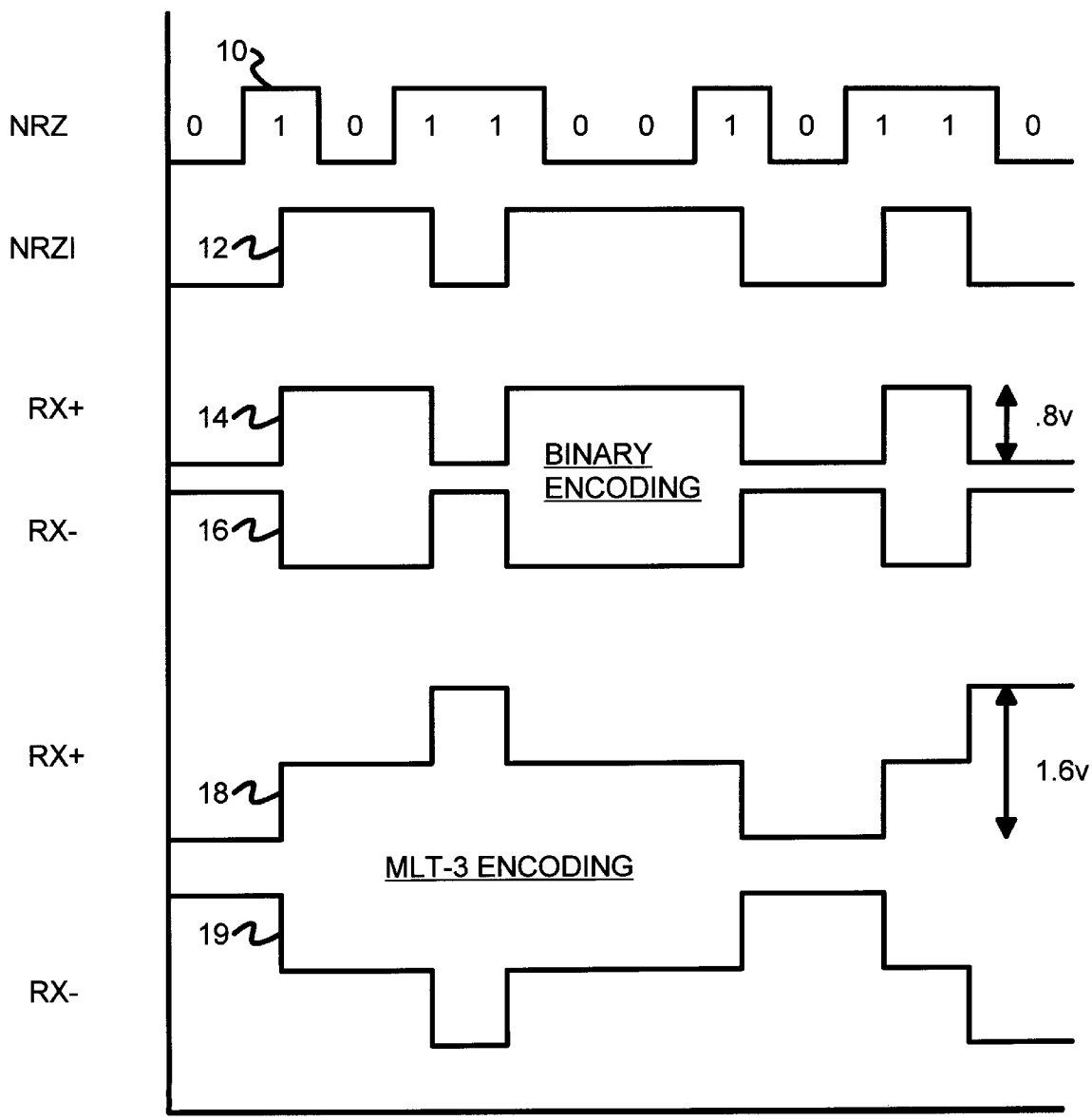
FIG. 2 is a waveform diagram of binary and MLT encoding.
Figure 3:
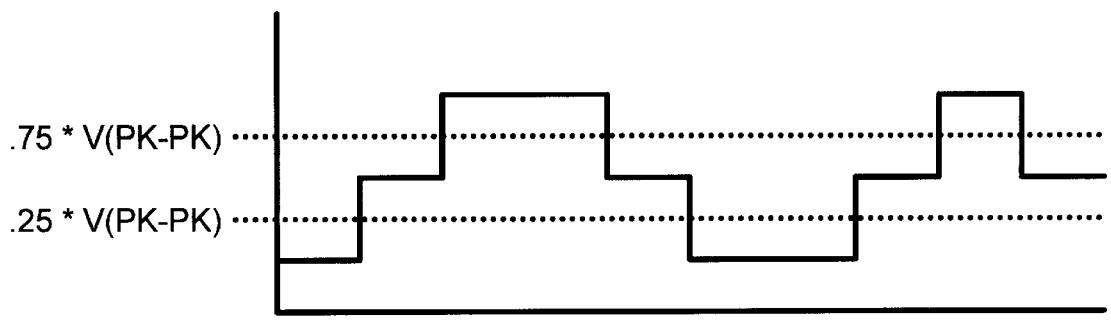
FIG. 3 is a diagram of a MLT input with two reference voltages used for detection.
Figure 4:
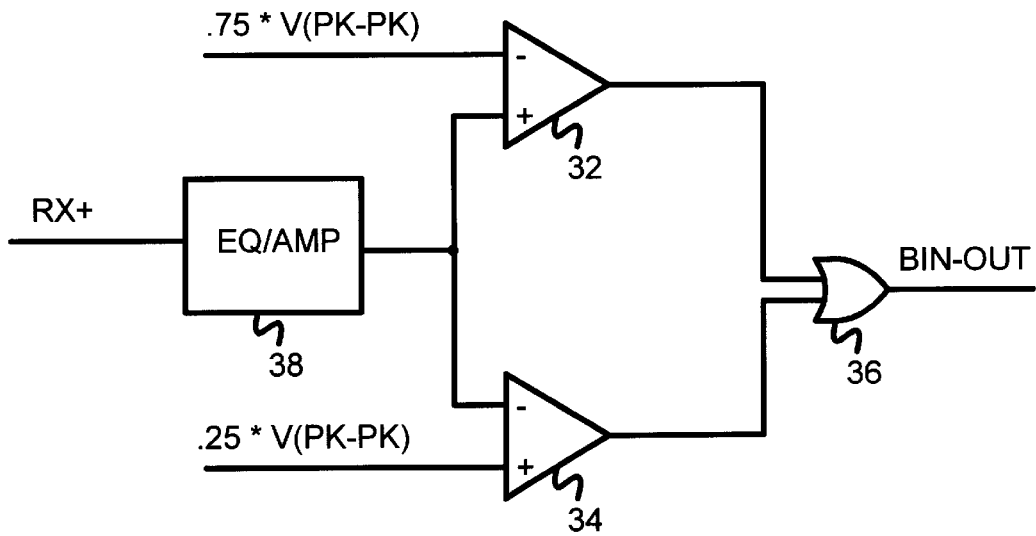
FIG. 4 is a diagram of a prior-art MLT receiver comparing the input to two voltage references.
Figure 5:
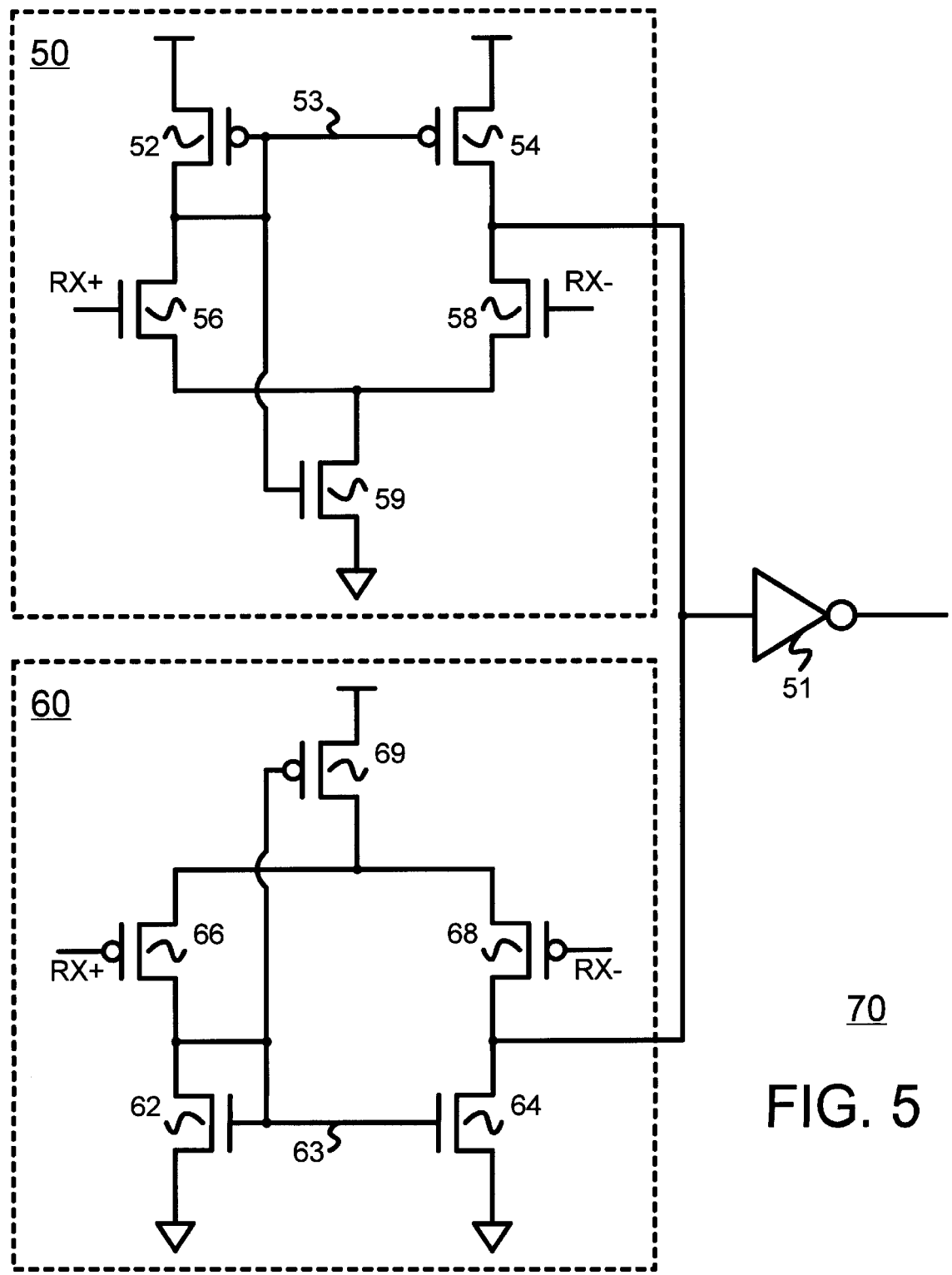
FIG. 5 is a schematic diagram of a complementary-amplifier PECL receiver.

FIG. 5 is a schematic diagram of a complementary-amplifier PECL receiver. N-type amplifier 50 uses n-channel differential transistors, while p-type amplifier 60 uses p-channel differential transistors. The RX+ and RX− inputs are coupled to the gates of n-channel differential transistors 56, 58 in n-type amplifier 50, and to the gates of p5 channel differential transistors 66, 68 in p-type amplifier 60. Current-mirror transistors 52, 54 are p-channel transistors in n-type amplifier 50, but current-mirror transistors 62, 64 are n-channel transistors in p-type amplifier 60. Node 53 is a bias voltage set by the drain of differential transistor 56. The bias voltage of node 53 controls the current through p-channel transistors 52, 54, and the tail current through n-channel tail transistor 59. This bias voltage depends on the input voltages applied to RX+ and RX−, and the sizes of all devices including transistors 52, 56, 59.

The gate-bias of node 63 in p-type amplifier 60 is set in a similar but inverted way. The bias voltage is set by the drain of differential p-channel transistor 66. The bias voltage of node 63 controls the current through n-channel current-mirror transistors 62, 64, and the head current through p-channel tail transistor 69. This bias voltage depends on the input voltages applied to RX+and RX−, and the sizes of all the devices. Note that the bias voltage for p-type amplifier 60 is a different voltage than the bias for n-type amplifier 50. These bias voltages change relative to each other as the input voltages change.

For extremely low input voltages on RX+ and RX−, n-channel differential transistors 56, 58 can shut off, disabling n-type amplifier 50. However, these low voltages do not turn off p-channel differential transistors 66, 68. P-type amplifier 60 continues to amplify the difference in inputs RX+, RX−. Thus self-biased comparator 70 continues to operate for low input voltages, resulting in a wider common-mode input range.

Self-Biasing Ideal for Complementary Amplifiers

Self-biasing of the tail-current transistors 59, 69 is ideal for the complementary-amplifier because adjustment of tail biasing and tail current occurs to compensate for input-voltage changes. In addition, since the output of n-type amplifier 50 is connected to the output of p-type amplifier 60, some current from one amplifier could be transferred to the other amplifier through their outputs. Self-biasing can correct for this current-swapping as well. A self-biasing comparator is fast because it is sensitive to both the input-signal levels and slopes of the signal levels.

Inverter 51 receives the outputs from amplifiers 50, 60 and outputs the detected, amplified voltage difference. Several inverters may be used as gain stages for increasing sensitivity.

Differential MLT Decoding Using Only One Voltage Reference

The inventors have also realized that one of the voltage references of the prior-art multi-level-transition-3 (MLT-3) decoder can be eliminated when differential inputs are used. Since the differential inputs are always inverses of each other, an upper voltage-reference effectively detects low states on the complementary input as well as upper voltages.

For example, an upper voltage reference applied to the RX+ input detects when RX+ is high and RX− is low. When the same upper voltage reference is applied to the RX− input, it detects when RX− is high. Since RX+must be low when RX− is high, detection of a high RX− input also detects when RX+ is low. Therefore, detection for both the RX+ high and RX+ low states can be made with a single voltage reference that is applied to both inputs.

One voltage reference can detect both high and low MLT-3 states. When neither a high nor a low is detected, then a logical mid-level state is detected. Only one voltage reference is needed for binary, although the binary reference voltage differs from the MLT-3 reference voltage.

Binary and MLT Decoding Using One Voltage Reference

Figure 6:
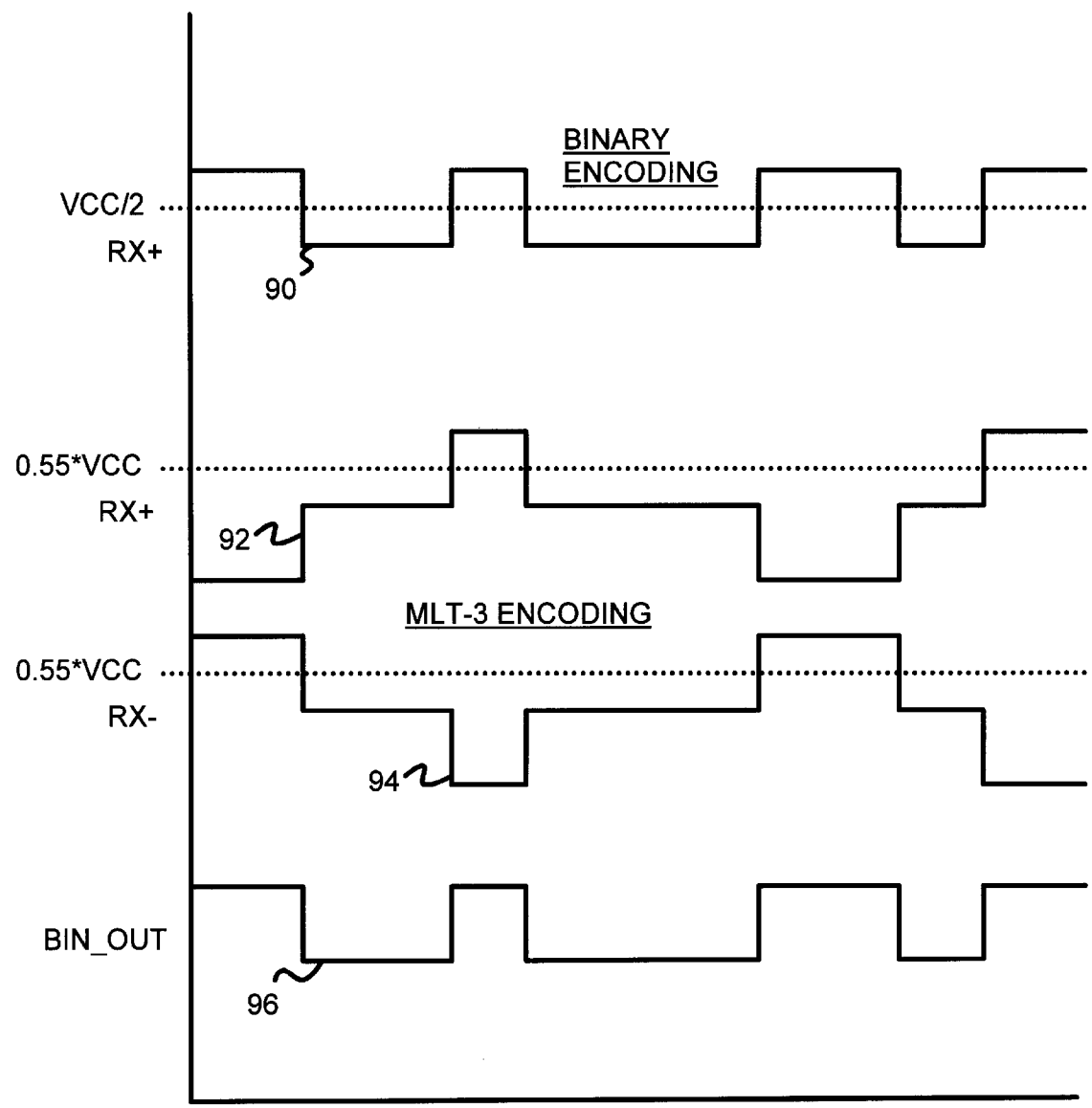
FIG. 6 shows waveforms of binary and MLT-3 detection and decoding.

FIG. 6 shows waveforms of binary and MLT-3 detection and decoding. Dotted lines are shown to represent reference-voltage levels used to detect high logical states. Binary waveform 90 shows the RX+ input, which is one of the differential inputs. The RX− input is the inverse of the RX+ input.

A single reference voltage is used to detect high and low values. When the RX+ input has a voltage greater than the reference, a high is detected and signaled. Otherwise, a low is detected and signaled. The reference for binary signals is set to half the power-supply voltage, Vcc/2. Other values for the reference voltage can be used to accommodate various termination and transmission line configurations.

During MLT-3 mode, the differential inputs RX+, RX− are driven by multi-level signals transitioning between high, low, and mid voltage levels. A single voltage reference is applied to both of the differential inputs. The voltage reference is set to a voltage between the mid and high voltage levels. When the mid level is at Vcc/2, a reference voltage of 0.55*Vcc is useful as it is slightly above the mid level.

When RX+ waveform 92 is above the reference voltage, a high RX+ is signaled. Since RX − is the complement of RX+, RX− is low during the times RX+ is detected high. Likewise, when RX− waveform 94 is above the same reference voltage of 0.55*Vcc, a high RX− is detected. Since RX− is the inverse of RX+, when a high RX− is detected, a low RX− is also signaled. Thus both the high and low states of RX+ are detected although only a single reference-voltage is used.

MLT waveforms 92, 94 can be converted to NRZI binary waveform 96 by generating a binary transition for each transition of MLT waveforms 92, 94. Since the reference voltage is crossed by either RX+ or RX− for each transition, changes in the detected states of RX+ and RX− can be used to signal transitions for binary waveform 96. The detection signal for RX+can be logically OR'ed with the detection signal for RX− to produce binary waveform 96.

Figure 7:
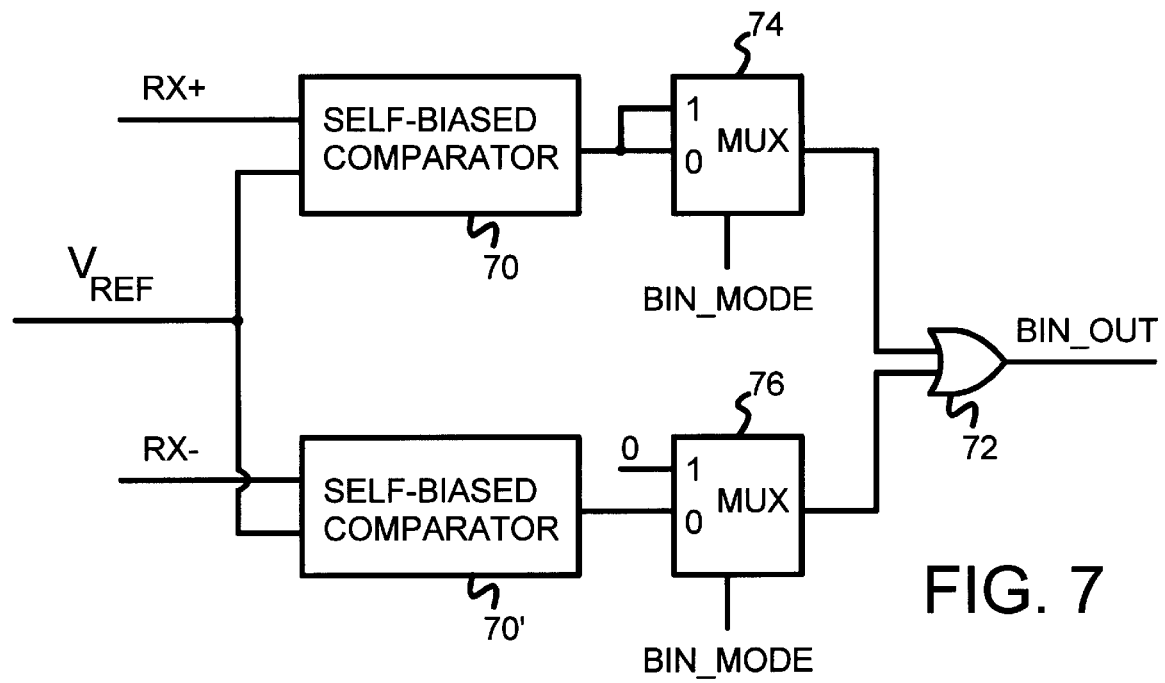
FIG. 7 is a diagram of an MLT-3-to-binary decoder using a single reference voltage for level detection.

Binary/MLT-3 Receiver & Ddecoder—FIG. 7

FIG. 7 is a diagram of an MLT-3-to-binary decoder using a single reference voltage for level detection. Two complementary self-biased comparators such as described for FIG. 5 are used in the front-end of the decoder of FIG. 7. First self-biased comparator 70 compares input RX+ to the reference voltage and outputs a high signal when input RX+ exceeds the reference voltage Vref. The RX+ input is connected as shown in FIG. 5, but the reference voltage Vref is connected to the other differential transistors rather than RX−. Both an n-type and a p-type amplifier are used in parallel in self-biased comparator 70 for a wide common-mode input range.

A second self-biased comparator 70' is identical to first self-biased comparator 70, except that it receives input RX− rather than RX+. For second self-biased comparator 70', the RX− input is connected to differential transistors 56, 66 rather than RX+ in FIG. 5, while reference voltage Vref is connected to the other differential transistors 58, 68 rather than RX−. Second self-biased comparator 70' outputs a high signal when input RX− exceeds reference voltage Vref. During MLT mode, muxes 74, 76 merely pass the outputs from self-biased comparators 70, 70' through to OR gate 72. OR gate 72 outputs the decoded binary signal as high when either RX+or RX− is high, exceeding reference voltage Vref. Any transition of inputs RX+, RX− from a high or a low state must pass through the mid level. At the mid-level, both RX+ and RX− are at the mid-voltage level and neither self-biased comparators 70, 70' outputs a high. Thus the mid-level state causes OR gate 72 to output a low. Thus each transition of RX+, RX− causes a transition of the output of OR gate 72. A high-to-low transition is output from OR gate 72 when either RX+ or RX− transitions high to the mid-level. A low-to-high transition of BIN_OUT from OR gate 72 is output when either RX+ or RX− transitions from the mid level to high. Thus MLT-3-to-binary NRZI decoding is accomplished by the apparatus of FIG. 7.

The MLT-to-binary decoder of FIG. 7 can operate with either binary or MLT-3 inputs, allowing one circuit to be used for both binary and multi-level applications. The value of voltage reference Vref is changed by a binary mode signal BIN_MODE for binary or MLT-3 reception. The different value of voltage reference Vref causes the detection threshold to shift up to 0.55*Vcc for MLT reception and down to Vcc/2 for binary reception.

Muxes 74, 76 also change the operation of the decoder depending on the reception mode. When BIN_MODE is low, muxes 74, 76 pass their inputs through to OR gate 72 for MLT-3 decoding. For binary mode when BIN_MODE is high, mux 74 again passes the detection signal for RX+ through to OR gate 72. However, mux 76 blocks the RX− detection output from self-biased comparator 70'. Instead, mux 76 outputs a constant zero to OR gate 72. OR gate 72 then simply passes the RX+ detection signal from self-biased comparator 70 through as the binary signal. Thus, both binary and MLT-3 signals are received and decoded by the same circuit.

Figure 8:
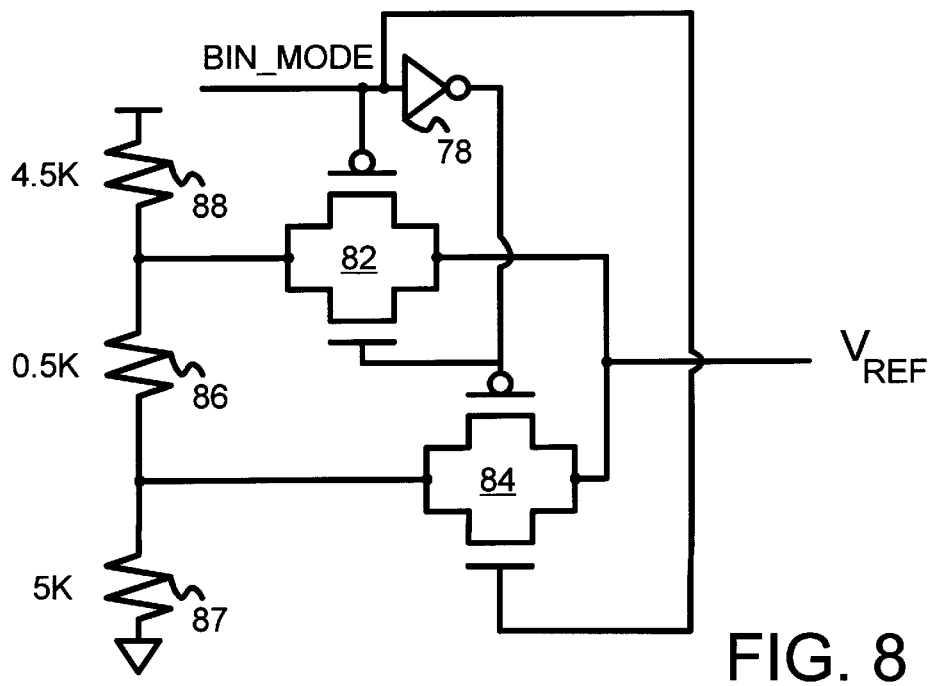
FIG. 8 shows a reference-voltage generator and selector for generating an adjustable reference voltage for binary or MLT-3 detection.

Reference-Voltage Selector for Binary and MLT-3—FIG. 8

FIG. 8 shows a reference-voltage generator and selector for generating an adjustable reference voltage for binary or MLT-3 detection. Resistors 88, 86, 87 form a voltage divider between the Vcc power supply and ground. Resistor 88 is a 4.5-Kohm resistor to Vcc, while resistor 87 is a 5-Kohm resistor to ground. Resistor 86 is a 500-ohm resistor connected in series between resistors 88, 87. Resistor 86 is programmable and can be trimmed for fine threshold adjustments.

When a 5-volt power supply is applied, current flowing through resistors 88, 86, 87 generate IR voltage drops to set two reference voltages. The lower voltage is halfway between Vcc and ground, at Vcc/2 or 2.5 volts. The upper voltage is (5.5/10)*5 volts above ground, or 2.75 volts, or 0.55*Vcc. The upper voltage is the desired Vref for MLT-3 detection, while the lower voltage is the desired Vref for binary detection.

A pair of transmission gates is used to select either the upper or the lower voltage from the voltage divider as the reference voltage Vref. Each transmission gate has a p-channel and an n-channel transistor so that the voltage is transmitted through without a significant change.

Transmission gate 82 is conducting and while transmission gate 84 is non-conducting when the mode signal BIN_MODE is low, selecting the upper voltage, 0.55*Vcc, as the reference voltage Vref for MLT mode. For binary mode, BIN_MODE is high, causing transmission gate 84 to conduct current, but disabling transmission gate 82. The lower voltage from the voltage divider, Vcc/2, is then selected as reference voltage Vref. Inverter 78 provides the inverse of BIN MODE for transmission gates 82, 84.

ADVANTAGES OF THE INVENTION

Only one voltage reference is needed, even for multi-level inputs having three voltage levels. The fact that the differential inputs are complements of each other is exploited to eliminate the second voltage reference. Both of the differential inputs are compared to a single threshold, using a single voltage-reference. Using just one voltage reference is an advantage because variations between the two references cannot occur when only one reference is used. Generating voltage references can draw active power, as when a voltage divider is used. Generating fewer references can reduce the power required, and simplify interconnect routing on the chip.

Self-biasing of the tail-current transistors is ideal for the complementary-amplifier because adjustment of tail biasing and tail current occurs to compensate for input-voltage changes. Since the output of the n-type amplifier is connected to the output of p-type amplifier, some current from one amplifier could be transferred to the other amplifier through their outputs. Self-biasing can correct for any current flow from one amplifier to the complementary amplifier.

The MLT-to-binary decoder of FIG. 7 can operate with either binary or MLT-3 inputs, allowing one circuit to be used for both binary and multi-level applications. A single voltage divider is used to generate two possible reference voltages. One of these references is selected as the single voltage reference used for detection. The reference voltage can be adjusted for binary or for MLT detection levels. Although two voltage references are generated, only one reference is used at any time. Therefore any variation between the two voltages does not affect detection as only one reference is used at any time.

The complementary PECL receiver is implemented in low-cost, standard CMOS. A wide common-mode input range is achieved since the input range extends almost to power and ground using complementary types of differential transistors. When a differential transistors of a first type shuts off, the other type of differential transistors remains on to amplify the input.

The amplifier is self-biased without using unforgiving bi-stable elements and feedback. Should the input fluctuate back and forth before settling, the amplifier is able to follow these fluctuations without getting locked into one state or another. Existing network equipment using either binary or multi-level encoding can be used with the invention. This single MLT-to-binary decoder operates with either binary or MLT input signals.

The receiver has a hysterises of 100 millivolts and low duty-cycle distortion with symmetric rise and fall times of the outputs when the complementary amplifiers are buffered by three inverters. Hysteresis is adjusted by tuning the ratio of the current-mirror devices. The amplifiers can be optimized for low, high, or mid-level input voltages by adjustment of relative device sizes. The self-biased comparator in the PECL receiver generally uses larger transistor sizes than does the self-biased comparator in the MLT-to-binary decoder.

ALTERNATE EMBODIMENTS

Several other embodiments are contemplated by the inventors. For example other kinds of encoding of data streams may be substituted. More complex multi-level-transition inputs may be used having more than three levels. When more levels are used, variations between the voltage references become more critical. The invention can still reduce the number of voltage references required for these more complex input signals, making more complex multi-level schemes feasible. The voltage-reference generator can be expanded to generate additional voltage references and select one or more of these references using additional resistors in the voltage divider and additional transmission gates for selection. Additional self-biased comparators can be used in parallel for additional comparisons with the additional voltage references. More complex decoding logic may be used than the simple OR gate described.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A differential receiver for decoding binary-encoded or multi-level-encoded differential inputs, the differential receiver comprising:

a pair of differential inputs including a first differential input and a second differential input, the pair of differential inputs receiving an input data stream encoded with binary data or encoded with multi-level-encoded data;

a reference-voltage generator for generating a binary reference-voltage and a multi-level reference-voltage;

a reference-voltage selector, coupled to the reference-voltage generator, for outputting the binary reference-voltage when the input data stream is encoded with binary data, and for outputting the multi-level reference-voltage when the input data stream contains the multi-level-encoded data, the reference-voltage selector outputting a reference-voltage;

a first differential comparator receiving the first differential input and receiving the reference voltage from the reference-voltage selector, for comparing a first voltage of the first differential input to the reference-voltage and outputting a first detection signal when the first voltage exceeds the reference-voltage;

a second differential comparator receiving the second differential input and receiving the reference voltage from the reference-voltage selector, for comparing a second voltage of the second differential input to the reference-voltage and outputting a second detection signal when the second voltage exceeds the reference-voltage; and a decoder, receiving the first detection signal from the first differential comparator and receiving the second detection signal from the second differential comparator, for outputting a decoded binary data stream, the decoder outputting the first detection signal as the decoded binary data stream when the input data stream is encoded with binary data, but the decoder outputting as the decoded binary stream a logical combination of the first detection signal and the second detection signal when the input data stream contains the multi-level-encoded data, whereby a single reference-voltage is compared to the first differential input and to the second differential input to detect and decode multi-level-encoded data.

2. The differential receiver of claim 1 wherein the first differential comparator and the second differential comparator each comprise:

an n-type amplifier having a pair of differential n-channel transistors receiving one of the first or second differential inputs as a received input and receiving the reference-voltage, the n-type amplifier generating an n-amp output responsive to a difference in voltage between the reference-voltage and the received input;

a p-type amplifier having a pair of differential p-channel transistors receiving the received input and receiving the reference-voltage, the p-type amplifier generating a p-amp output responsive to a difference in voltage between the reference-voltage and the received input;

connection means for connecting the n-amp output to the p-amp output as a composite output; and buffering means, receiving the composite output, for buffering the composite output to generate the first or second detection signal, whereby the n-type amplifier and the p-type amplifier both compare the received input to the reference-voltage in parallel.

3. The differential receiver of claim 2 wherein for low voltages of the received input the differential p-channel transistors of the p-type amplifier continue to operate and conduct current while the differential n-channel transistors of the n-type amplifier are shut off, not conducting current; and wherein for high voltages of the received input the differential n-channel transistors of the n-type amplifier continue to operate and conduct current while the differential p-channel transistors of the p-type amplifier are shut off, not conducting current, whereby either the n-type amplifier or the p-type amplifier continue to operate at the high or low voltages, extending a common-mode input-voltage range of the differential comparator.

4. The differential receiver of claim 3 wherein the n-type amplifier further comprises a current mirror of p-channel transistors for generating a first internal bias voltage for controlling current supplied by the current mirror to the differential n-channel transistors, and wherein the p-type amplifier further comprises a current mirror of n-channel transistors for generating a second internal bias voltage for controlling current supplied by the current mirror to the differential p-channel transistors.

5. The differential receiver of claim 4 wherein the n-type amplifier further comprises a tail n-channel transistor coupled to source terminals of the differential n-channel transistors, the tail n-channel transistor controlling a tail current in response to a control gate, the control gate connected to the first internal bias voltage generated by the current mirror of p-channel transistors; and wherein the p-type amplifier further comprises a tail p-channel transistor coupled to source terminals of the differential p-channel transistors, the tail p-channel transistor controlling a second tail current in response to a second control gate, the second control gate connected to the second internal bias voltage generated by the current mirror of n-channel transistors, whereby the tail p-channel transistor and the tail n-channel transistor are self-biased by the current mirror.

6. The differential receiver of claim 5 wherein the n-type amplifier and the p-type amplifier do not receive any bias voltages except for the reference-voltage for comparison to the received input, whereby external bias voltages are not needed since the n-type amplifier and the p-type amplifier are self-biased.

7. The differential receiver of claim 2 further comprising:

a mode input for receiving a mode signal, the mode signal being in a first state to indicate when the input data stream is encoded with the binary data, the mode signal being in a second state indicating multi-level mode when the input data stream contains the multi-level-encoded data, the reference-voltage selector receiving the mode signal to output the binary reference-voltage when the mode signal is in the first state, but outputting the multi-level reference-voltage when the mode signal is in the second state, whereby the mode signal controls the reference-voltage selected for binary or multi-level input reception.

8. The differential receiver of claim 7 wherein the decoder further comprises OR means for generating the logical OR of the first detection signal and the second detection signal, whereby the logical combination of the first detection signal and the second detection signal is a logical OR of the first detection signal and the second detection signal.

9. The differential receiver of claim 8 wherein the decode means further comprises:

muxing means, receiving the second detection signal, for blocking the second detection signal when the mode signal is in the first state but for passing the second detection signal to the OR means when the mode signal is in the second state indicating the multi-level mode, whereby the mode signal controls the decode means for binary or multi-level input decoding.

10. The differential receiver of claim 9 wherein the reference-voltage selector comprises:

an output for outputting a selected reference-voltage as the reference-voltage;

a voltage divider for generating the binary reference-voltage and the multi-level reference-voltage;

a first transmission gate having a p-channel pass transistor and an n-channel pass transistor for connecting the binary reference-voltage from the voltage divider to the output when the mode signal is in the first state; and a second transmission gate having a p-channel pass transistor and an n-channel pass transistor for connecting the multi-level reference-voltage from the voltage divider to the output when the mode signal is in the second state, whereby the mode signal controls the reference-voltage selected for binary or multi-level input reception.

11. The differential receiver of claim 2 wherein the multi-level-encoded data stream comprises three voltage levels and wherein the binary-encoded data comprises only two voltage levels for each of the differential inputs.

12. The differential receiver of claim 11 wherein the multi-level-encoded data is a multi-level-transition-3 (MLT-3) encoded data stream and wherein the binary data is a not-return-to-zero-invert-on-ones (NRZI) encoded data stream.

* * * * *